United States Patent [19]

Teverovsky et al.

[11] Patent Number: 5,383,969

[45] Date of Patent: Jan. 24, 1995

[54] PROCESS AND APPARATUS FOR SUPPLYING ZINC VAPOR CONTINUOUSLY TO A CHEMICAL VAPOR DEPOSITION PROCESS FROM A CONTINUOUS SUPPLY OF SOLID ZINC

[75] Inventors: Alexander Teverovsky, Concord; James C. MacDonald, Stoneham; Michael A. Pickering; Jeffery L. Kirsch, both of Dracut, all of Mass.

[73] Assignee: CVD, Inc., Woburn, Mass.

[21] Appl. No.: 42,933

[22] Filed: Apr. 5, 1993

[51] Int. Cl.6 .................... C23C 16/00; C23C 14/00
[52] U.S. Cl. ........................... 118/719; 118/724; 118/725; 118/726; 427/255.2
[58] Field of Search ............. 118/719, 724, 725, 726; 427/255.2

[56] References Cited

U.S. PATENT DOCUMENTS

| | | | |
|---|---|---|---|
| 2,554,902 | 5/1948 | Godley, 2nd | 315/106 |
| 2,914,643 | 11/1959 | Fields et al. | 219/19 |
| 3,086,496 | 4/1963 | Strong | 118/49 |
| 3,086,889 | 4/1963 | Strong | 117/227 |
| 3,097,113 | 7/1963 | Welsh | 118/49 |
| 3,541,301 | 11/1970 | Gallet | 219/271 |
| 3,750,623 | 8/1973 | Carpenter et al. | 118/49.5 |
| 4,353,938 | 10/1982 | Sterling et al. | 427/214 |
| 4,811,691 | 3/1989 | McJilton | 118/726 |

*Primary Examiner*—Richard Bueker
*Attorney, Agent, or Firm*—Mark F. LaMarre; Gerald K. White

[57] ABSTRACT

A process and apparatus for the manufacture of chemical vapor deposition deposited structures which comprises supplying a solid zinc metal continuously to a heated retort at a controlled rate. The retort is a body of refractory material having a top and a bottom and a traverse cross section which decreases from the top to the bottom of the retort. The zinc is melted, vaporized, and conveyed to a chemical vapor deposition zone defined by a number of heated mandrel plates where it is reacted with either hydrogen sulfide or hydrogen selenide to form a chemical vapor deposited structure. The process and apparatus provide for improved control over the evaporation rate of zinc and a reduction in the furnace volume needed to melt and vaporize the zinc.

21 Claims, 3 Drawing Sheets

PROCESS AND APPARATUS FOR SUPPLYING ZINC VAPOR CONTINUOUSLY TO A CHEMICAL VAPOR DEPOSITION PROCESS FROM A CONTINUOUS SUPPLY OF SOLID ZINC

BACKGROUND OF THE INVENTION

1. Field of the Invention

This invention relates to a process using chemical vapor deposition for the manufacture of chemical vapor deposited structures, such as discs, domes, and plates. In particular this invention relates to an improved process for providing enhanced control of the rate of zinc vapor supplied to the chemical vapor deposition process.

2. Description of Related Art

In the manufacture of ZnS or ZnSe components by chemical vapor deposition (CVD), as shown in FIG. 1, a mold upon which the CVD structure is to be deposited is placed in a CVD furnace above a source of zinc metal. Typically, the mold is made from a number of graphite mandrel plates which are arranged in the form of a rectangular box and bolted together. The CVD furnace is then covered, sealed, and vacuum connections are attached in preparation for operation of the CVD process. The furnace is heated to operating temperature (650°–700° C.) and a flow of reaction gas, $H_2S$ or $H_2Se$, and an inert carrier gas, such as argon, is initiated. The CVD process continues until a sufficient depth of material is deposited, after which the furnace is cooled (approximately 24 hours) and the mold containing the CVD deposited structures is disassembled and the structures are removed from the furnace.

The current method of supplying zinc vapor to the reaction, as shown in FIG. 1 consists of graphite retorts 10 located inside the CVD furnace 12 below the mandrel plates 14 upon which the CVD parts are deposited. The retorts are loaded with solid zinc, either in the form of balls or disks. The retorts 10 contain the supply of zinc for the entire run (135–455 kg. capacity). These retorts are then heated to approximately 650° C. to melt and then evaporate the zinc. The evaporation rate of zinc is a function of the surface area of the molten zinc 16, temperature at the surface of molten zinc, and pressure in the retorts 10. The measurement of the zinc evaporation rate is done by calculating the change in volume of the molten zinc 16 over time. The change in volume is calculated by periodically measuring the level of the molten zinc 16 and calculating the rate by dividing the change in the level of the molten zinc by the period of time between which the readings were taken. The measurement of the liquid zinc level is done with a graphite float 18 on the zinc surface 20 which supports a graphite rod 22, a quartz connecting rod 24, and the magnetic core 26 of a linear variable differential transformer 28 (LVDT). As the zinc evaporates the level decreases and the core moves inside the LVDT to produce an electrical signal that is sent to an output device. This method has a number of disadvantages as discussed in the following paragraphs.

The temperature at which the molten zinc is to be maintained varies with each run due to the flow rate of zinc required, the condition of the insulation, the temperature of the cooling water, and the amount of zinc in the retort. The temperature is measured at the outer surface of the retort. The retort temperature at the beginning of the run is selected based on operating data from previous runs. Normally, the temperature of the molten zinc has to be adjusted during the course of the run due to changes which take place during the run that affect the surface area of the molten zinc and the pressure within the CVD furnace. For example, the surface area of the liquid zinc can be decreased by contamination, or "slag," that floats on the surface. Also, the retort pressure may also change due to contaminants collected by the zinc filter. The amount of zinc in the retort is constantly decreasing. These events may require a change in the retort temperature. Several data points must be collected to properly determine the necessary temperature adjustment of the molten zinc. Such adjustments usually take several hours.

Adjusting the temperature of the molten zinc is further complicated by a time lag between a change in temperature and when the effect is noticed due to the large mass of material present in the retort. Also, the first measurement of the molten zinc level after a change has been made may appear to be the opposite of the desired effect and may mask the actual evaporation rate. When the temperature is increased to increase the evaporation rate of the zinc, the zinc and graphite expand. A measurement of the zinc level at this time makes it appear as though the evaporation rate is decreasing, and vice versa. It may take several hours of process time to obtain the correct measurement.

In addition, the reading from the LVDT is difficult to evaluate due to the graphite float on the unstable surface of the liquid zinc. The float and connecting rods also tend to stick and drag on side wall of the LVDT protection tube and openings. Again, due to these difficulties is may take several hours of process time to determine the true trend of the evaporation rate.

Further, the assembly of the retorts and the LVDT is difficult. The assembly requires filling multiple retorts with large amounts of zinc, and the alignment of the LVDT. The success rate of this operation is approximately 80%. In addition, the length of the runs is limited by the amount of zinc that can be loaded into the retorts. Also, a large amount of energy is consumed due to the large mass of the zinc, retort, and furnace which must be heated so that the zinc metal can be evaporated.

During the CVD process, it is desirable to provide a constant supply of zinc vapor to be reacted with a reaction gas in the presence of mandrel plates to form a CVD structure. Further, it is desirable to provide instantaneous information on the rate of zinc vaporization during the CVD process.

A solution to the problem of providing metal vapor to a metal coating process is suggested by Strong, U.S. Pat. No. 3,086,889. Strong discloses a wire metal feed to a tapered insulated boat for providing metal vapor for applying a thin metal film directly to a dielectric sheet without a chemical reaction, under low pressure in a continuous operation.

SUMMARY OF THE INVENTION

An object of this invention is to provide a controlled supply of metal vapor to a CVD reactor for reacting with a reaction gas to form a chemical vapor deposited structure.

Another object of this invention is to provide a constant supply of metal vapor to a CVD reactor for reacting with a reaction gas to form a chemical vapor deposited structure.

Another object of this invention is to provide a method and apparatus which permits an accurate determination of the rate at which metal vapor is provided to the chemical vapor deposition process.

Another object of this invention is to provide a method and apparatus which permits supplying a source of metal to be vaporized within a CVD furnace, wherein the zinc metal is provided continuously to the CVD furnace from a source external to the CVD furnace.

These and other objectives of the invention, which will become apparent from the following description, have been achieved by a novel process for the manufacture of chemical vapor deposition structures, whereby metal is supplied continually from a source external to the CVD furnace to a heated retort having a cross section which decreases from the top to the bottom of the retort. The metal is first melted, then vaporized and the vaporized metal is conveyed to a chemical vapor deposition zone where it is reacted with a reaction gas to form a CVD structure on a plurality of heated mandrel plates.

The process for the manufacture of chemical vapor deposition deposited structures comprises, in combination, supplying a solid metal substantially continuously to a retort at a controlled rate. The retort is made from a body of refractory material having a top and a bottom and a transverse cross section which continually decreases from the top of the retort to the bottom of the retort. For example, the cross section of the retort may be conical or a truncated conical shape. The retort is then heated to vaporize the metal. Normally, the retort is heated to vaporization temperature and then maintained at a constant temperature, however the temperature of the retort may be varied depending on the product and/or process requirements. The metal vapor is then conducted to a chemical vapor deposition zone which is defined by at least one heated mandrel plate. A reaction gas is provided and conducted to the chemical vapor deposition zone, where it reacts with the metal vapor to form a product. The product is then deposited onto the heated mandrel plates to form a chemical vapor deposited structure. Typically, a plurality of heated mandrel plates is used.

Normally, for the production of ZnS and ZnSe, zinc metal is used. The zinc metal is provided in the form of a continuous strip having a uniform cross-section. Ideally the zinc metal is provided in the form of a wire or a ribbon. The reaction gas under these circumstance is either hydrogen sulfide or hydrogen selenide.

Once the zinc metal has been vaporized the vapor is swept through a filter media and conveyed through a connecting tube to a manifold. The manifold distributes the zinc vapor evenly across the chemical vapor deposition chamber.

In addition, this invention include a novel apparatus for the manufacture of chemical vapor deposition deposited structures, whereby metal is supplied continually from a source external to the CVD furnace to a heated retort in the CVD furnace. The retort has a cross section which decreases from the top to the bottom of the retort. The metal is melted in the retort, then vaporized, and the vaporized metal is conveyed to a chemical vapor deposition chamber where it is mixed and reacted with a reaction gas to form a CVD structure on at least one of the heated mandrel plates.

The apparatus for the manufacture of chemical vapor deposition deposited structures comprises, in combination, a means for supplying solid metal substantially continually to a heated retort at a controlled rate. The means for supplying the metal is external to the CVD furnace. The retort is made from a body of refractory material having a top and a bottom and a transverse cross section which continually decreases from the top of the retort to the bottom of the retort. For example, the cross-section of the retort may be conical or a truncated conical shape. The retort is heated to a temperature sufficient to vaporize the metal. Normally, the retort is heated to vaporization temperature and then maintained at a constant temperature, however the temperature of the retort may be varied depending on product and/or process requirements. The metal vapor is then conducted through a conduit to a chemical vapor deposition chamber which is defined by one or more heated mandrel plates. A device for providing a reaction gas and a device for conducting the reaction gas to the chemical vapor deposition chamber is supplied where it reacts with the metal vapor to form a product. The product is then deposited onto the heated mandrel plates to form a chemical vapor deposited structure. Typically, a plurality of heated mandrel plates is used. As discussed hereinabove, the zinc metal in the form of wire or ribbon is used normally. Also, the reaction gas is typically either hydrogen sulfide or hydrogen selenide.

BRIEF DESCRIPTION OF THE DRAWINGS

With this description of the invention, a detailed description follows with reference being made to the accompanying figures of drawings which form part of the specification related thereto, in which like parts are designated by the same reference numbers, and of which.

DETAILED DESCRIPTION OF THE INVENTION

Figure 1:
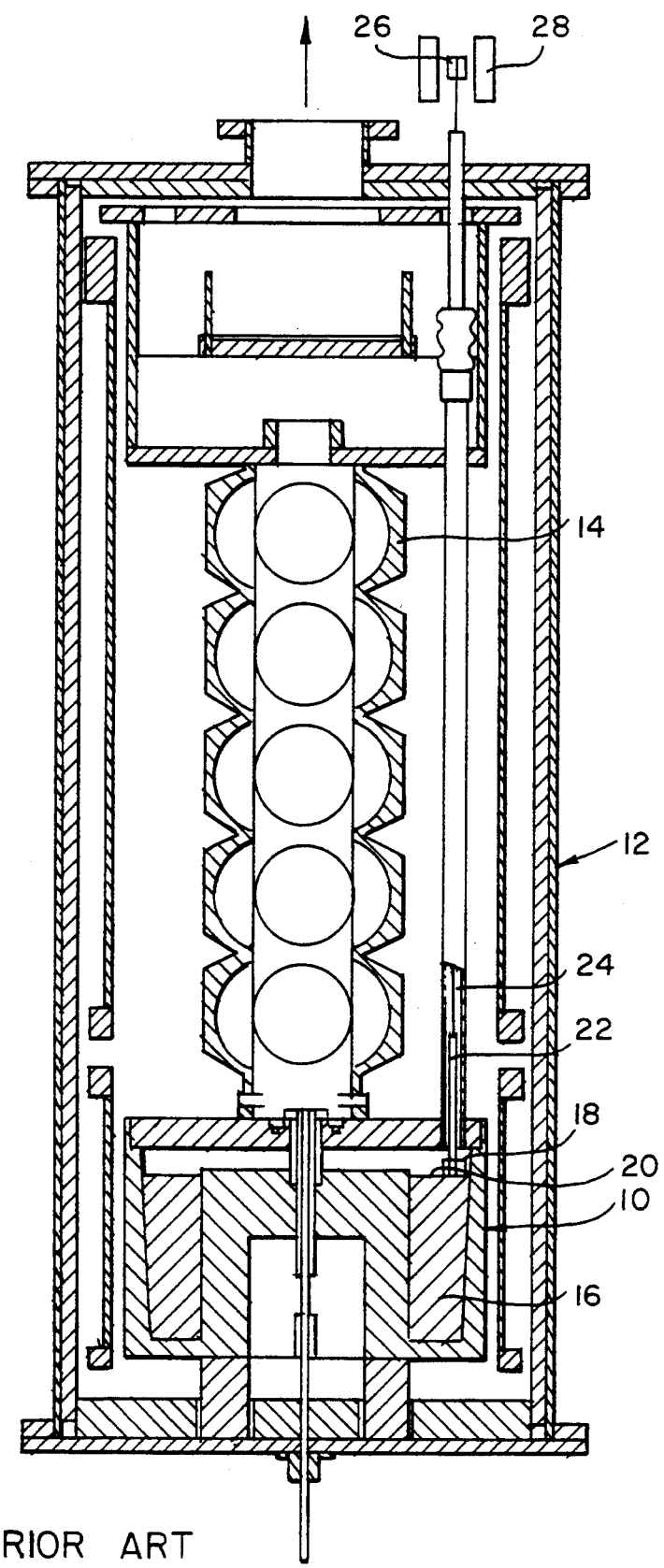
FIG. 1 is a cross-section view illustrating a conventional CVD furnace.
Figure 2:
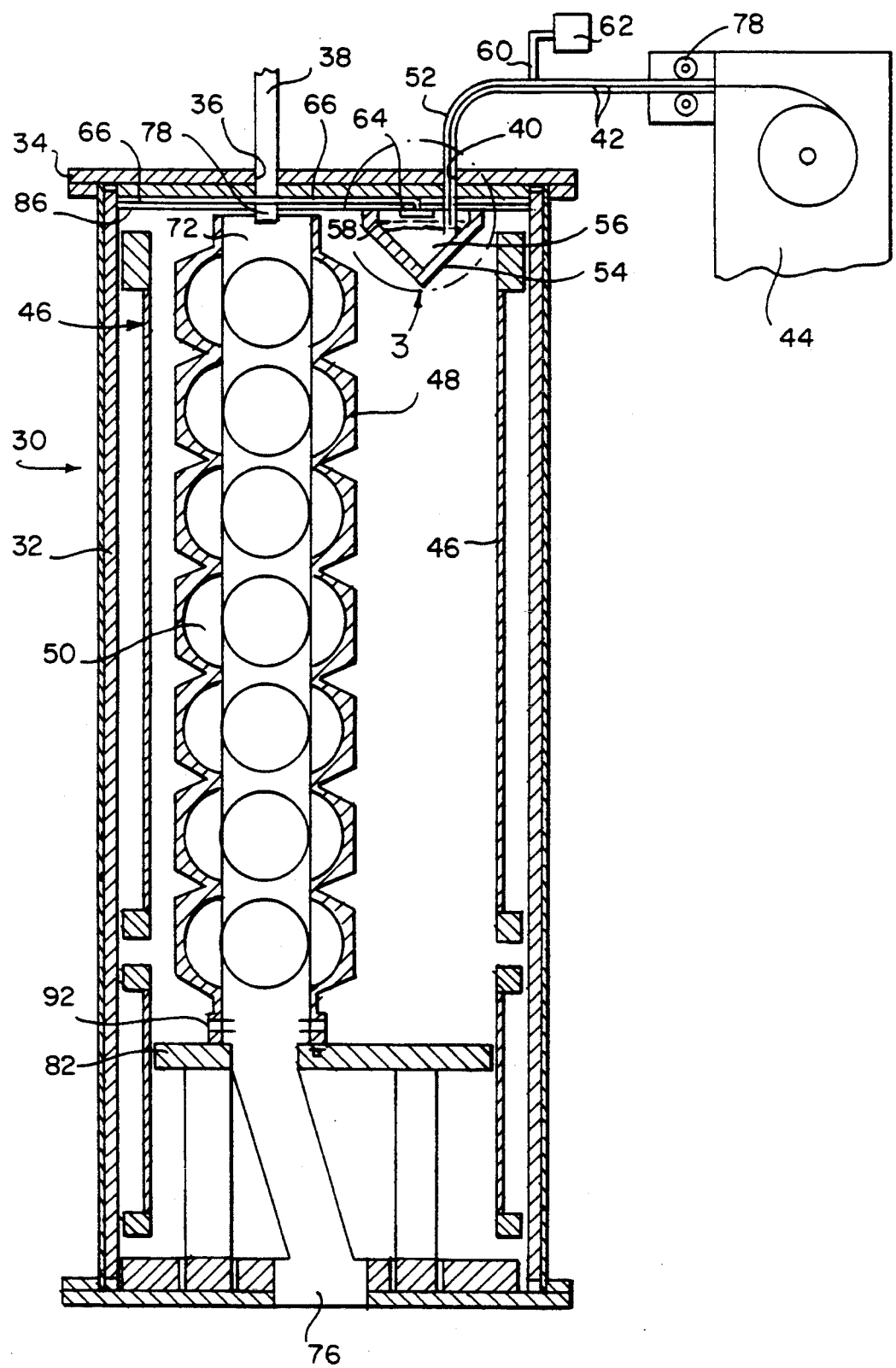
FIG. 2 is a diagram illustrating an apparatus of this invention.

The chemical vapor deposition furnace of this invention, as best seen in FIG. 2, shown generally at 30 is provided for forming a structure by chemical vapor deposition. The chemical vapor deposition (CVD) furnace 30 for use with this invention includes an insulated outer wall 32 supporting a cover plate 34. The cover plate 34 has an gas inlet port 36 for reaction gas 38 and a metal inlet port 40 for the introduction of solid metal 42 into the CVD furnace 30.

Figure 4:
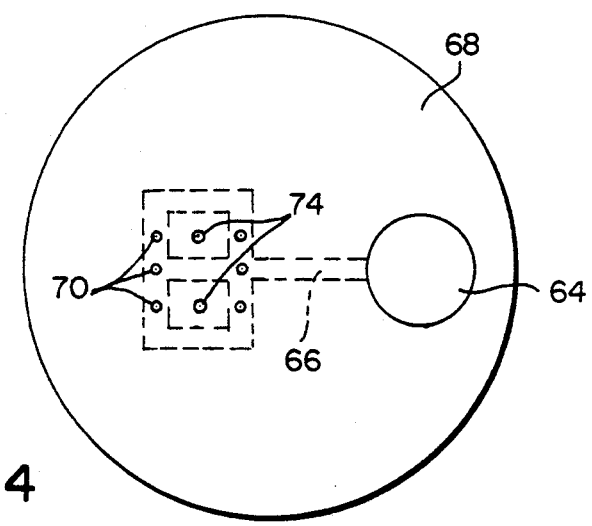
FIG. 4 is a bottom plan view of the furnace cover plate illustrating the zinc-vapor transport system and gas manifold of FIG. 2.
Figure 5:
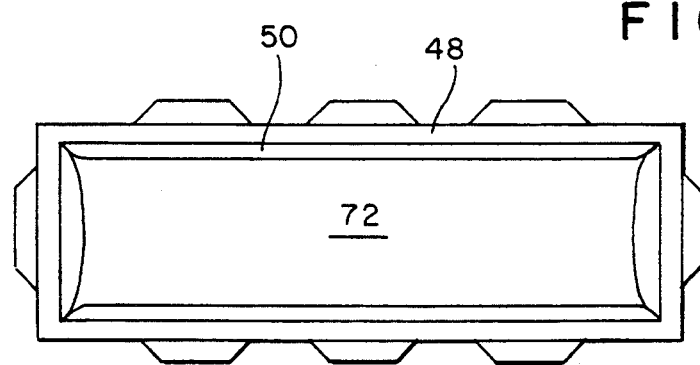
FIG. 5 is a top plan view of the mandrel plates in assembled form illustrating the chemical vapor deposition zone.

The solid metal 42 is fed from a metal supply source 44. Heating elements 46 contained within the CVD furnace 30 provide heat to melt the solid metal 42 and to heat the mandrel plates 48 upon which a CVD deposited structure 50 is formed. Solid metal 42 is fed from the metal supply 44 through a metal supply tube 52 and the metal inlet port 40 into a retort 54 where the solid metal 42 is melted to form a reservoir of molten metal 56. The molten metal 56 is vaporized to form metal vapor 58 and is transported by a metal vapor carrier gas 60 supplied from a gas source 62 trough the metal supply tube 52 along with the solid metal 42. The metal vapor 58 passes through a filter 64, and a conduit 66 in a manifold 68 and exits through metal vapor exhaust holes 70 and into the top portion of deposition chamber 72 in the CVD furnace 30. The deposition chamber 72 is the space defined by the mandrel plates 48 as is shown in FIG. 5. A reaction gas 38 is fed into the CVD furnace 30 through gas inlet port 74 in metal vapor manifold 68 in close proximity to the metal vapor exhaust holes 70, as shown in FIG. 4. The metal vapor 58 and the reaction gas 38 react in the deposition chamber 72 and deposit on the mandrel plates 48 to form the CVD deposited structure 50. Dust and the carrier gases are drawn down through the deposition chamber 72 and out of the CVD furnace 30 through exhaust vent 76 to an exhaust gas control system (not shown).

The solid metal 42 fed from the metal supply 44 is preferably in the form of metal wire or ribbon, although metal spheres or the like can be used. Zinc metal is typically used, however, other metal may be used in a similar process. The zinc metal used in the process typically has a purity of 99.99%. The solid metal wire is fed from the metal supply 44 to the metal supply tube 52 by conveying means such as a roll feeder 78 controlled by a variable speed motor and controller (not shown). An inert metal vapor carrier gas 60, such as; helium, neon, argon, krypton, or nitrogen, is supplied from a gas supply 62 through the metal supply tube 52 along with solid metal. The metal supply 44 is sealed and maintained at the same pressure as the CVD furnace 30 for most efficient operation.

Figure 3:
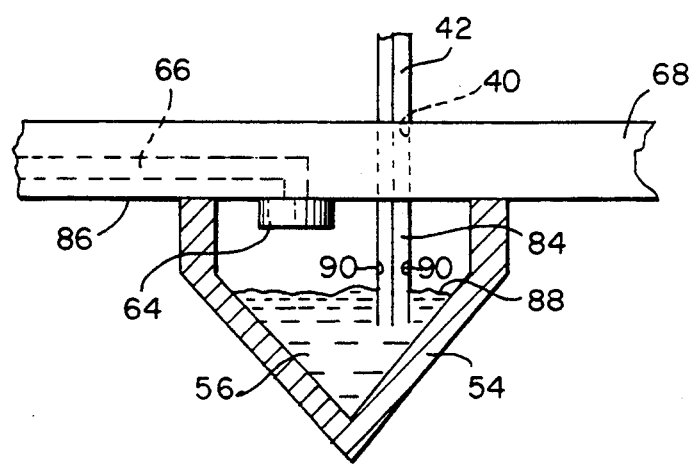
FIG. 3 is a detailed view of area 3 of FIG. 2 illustrating the retort for use with this invention.

The solid metal 42 is fed into the CVD furnace 30 through metal supply tube 52 and into retort 54 as shown in FIGS. 2 and 3. The retort is such that the cross section of the retort continually decreases from the top of the retort 54 to the bottom. This cross section can be in the form of a cone or V-shape, or a truncated cone where the base of the cone is flattened. It is believed that the decreasing cross section of the retort 54 acts as a self correcting control of the evaporation rate of the metal being evaporated. As the level of molten metal 56 increases the surface area available for evaporation increases, and therefore the rate of evaporation. As the evaporation rate increases, the level of molten metal 56 decreases thus reducing the surface area available, which in turn reduces the rate of evaporation. The retort 54 can be threaded into the metal vapor manifold 68. The retort 54 used with this invention typically weighs from 6 to 10 pounds. The retort 54 as with the internal parts of the CVD furnace 30 are made of graphite of a grade suitable for high temperature applications.

It can be readily seen that a retort 54 of this size takes up far less volume in the CVD furnace 30 and requires far less energy to heat to operating temperature compared to the aforementioned prior art. This results in a substantial reduction in the overall volume of the CVD furnace 30 or an increase in the volume available for deposition.

To provide a clean surface of molten metal 56 for evaporation an induction tube 84 is provided, as shown in FIG. 3, through which the solid metal 42 passes. The induction tube 84 is attached to the inside surface 86 of the metal vapor manifold 68. The tube extends below the surface 88 of the molten metal 56. As the solid metal passes through the induction tube 84, it comes in contact with the molten metal 58 in the retort 54. As the solid metal 42 melts, impurities in the metal form a layer of slag in the induction tube 84, while the pure metal enters the retort 54 and is available for evaporation. Fresh solid metal 42 can pass through the slag unaffected. Exhaust holes 90 are provided in the induction tube 84 above the level of the molten metal 56 to permit the carrier gas to flow above the surface of the molten metal 56.

The molten metal 56 is then evaporated from the retort 54 and is carried by the metal vapor carrier gas through filter 64 as shown in FIG. 4. The filter contains ceramic filter material to remove dust and particulate matter from the metal vapor 58 gas stream. The metal vapor 58 passes through conduit 66 in the metal vapor manifold 68 and through metal vapor exhaust holes 70. The metal vapor exhaust holes 70 introduces the metal vapor 58 into the top of the deposition chamber 72 where it reacts with reaction gas 38. The reaction product is deposited on mandrel plates 48 to form the CVD deposited structure 50. Dust and carrier gases are drawn out of the bottom of the CVD furnace.

A reaction gas 38, typically either H2S or H2Se, and an inert carrier gas are fed to the furnace 30 through gas inlet 36. The flow rate of the gas is controlled by appropriate means known in the art. The flow of reaction gas 38 is initiated when the temperature of the molten metal 56 has been increased to a specified level wherein the vapor pressure is sufficient to provide a continuous supply of zinc vapor for the CVD process.

It has been observed that the concurrent down flowing arrangement of dust and carrier gases produces a superior product having reduced imperfections due to dust being trapped in the CVD deposited structure 50. This is believed to be due to the gas and dust flowing with the gravitational forces. In a conventional CVD furnace gas and dust flows upward and is opposed by gravitational forces. Some dust may slow sufficiently to be trapped in the CVD deposited structure 50 causing imperfections. With the invention described hereinabove dust is less likely to slow so as to be trapped in the CVD deposited structure 50.

The device and method of this invention are applied to CVD furnaces for the manufacture of CVD deposited structures 50 such as domes or the like. The CVD furnace 30 used with this invention is prepared by loading mandrel plates 48 into the furnace and placing them on tracks 92 attached to the mandrel base plate 82. A cover plate 34 is then placed on the CVD furnace 30 and gas and metal inlets are attached. The mandrel plate can be attached with a removable support means, as disclosed in copending application 08/042,942 which was filed at the same time as this application. The application of which is assigned to the assignee of the present application, the disclosure of which application is incorporated herein by reference. The gas inlet ports 74 are located in close proximity to the metal vapor exhaust holes 70. As required, the mandrel plates may be held in place temporarily while the cover plate 34 is put into place and the furnace is covered. The furnace is then sealed and connected to the exhaust system (not shown). The CVD region of the furnace and the retort region are heated to operating temperature. The flow of reaction gas 38 and the inert carrier gas; such as helium, neon, argon, krypton, or nitrogen, is initiated. Solid metal 42 is then fed to the retort 54. The ratio of the gas flow rate of the reaction gas 38 to the feed rate of the solid metal 42 is maintained at approximately stoichiometric ratios. The chemical vapor deposition process is then monitored by appropriate means known in the art. When the chemical vapor deposition process is completed, the furnace is cooled and the CVD furnace is then opened and the CVD deposited material is removed for inspection and finishing of the final product.

Thus, in accordance with the invention, there has been provided a method and a device which to provide a controlled supply of metal vapor to a CVD reactor for reacting with a reaction gas to form a chemical vapor deposited structure. There has also been provided a method and a device which provide a constant supply of metal vapor to a CVD reactor for reacting with a reaction gas to form a chemical vapor deposited structure. There has also been provided a method and a device to which permits an accurate determination of the rate at which metal vapor is provided to the chemical vapor deposition process. Additionally, there has been provided a method and a device to which permits supplying a source of metal to be vaporized within a CVD furnace, wherein the zinc metal is provided continuously to the CVD furnace from a source external to the CVD furnace.

With this description of the invention in detail, those skilled in the art will appreciate that modification may be made to the invention without departing from the spirit thereof. Therefore, it is not intended that the scope of the invention be limited to the specific embodiments that have been illustrated and described. Rather, it is intended that the scope to the invention be determined by the scope of the appended claims.

We claim:

1. A process for the manufacture of chemically deposited structures by chemical vapor deposition comprising, in combination:
   supplying solid metal substantially continuously to a retort at a controlled rate, said retort consisting of a body of refractory material having a top and a bottom and a transverse cross section wherein the cross-section continually decreases from the top of the retort to the bottom of the retort;
   heating said retort to melt said metal to form molten metal having a surface layer;
   vaporizing said metal;
   conducting said metal vapor to a chemical vapor deposition zone by conveying said metal vapor through a conduit, and diffusing said metal vapor across the cross section of said deposition zone defined by a plurality of heated removable mandrel plates;
   providing a reaction gas and conducting said reaction gas to said chemical vapor deposition zone; and
   reacting said metal vapor and said reaction gas to form a reaction product and depositing the product onto said heated removable mandrel plates to form a chemical vapor deposited structure.

2. The process of claim 1 wherein the metal is zinc.

3. The process of claim 2 wherein the zinc metal is provided in the form of a continuous strip having a narrow cross-section.

4. The process of claim 2 further comprising providing the zinc in the form of a wire.

5. The process of claim 3 further comprising providing the zinc in the form of a ribbon.

6. The process of claim 1 further comprising heating said retort to vaporization temperature and maintaining said retort at a constant temperature.

7. The method of claim 1 wherein the solid metal is supplied through an induction tube that extends below the surface of the molten metal in the retort and impurities in the metal are removed in the form of a layer of slag in said induction tube and purified metal enters the retort.

8. The process of claim 1 wherein the cross-section of said retort is conical in shape.

9. The process of claim 1 wherein the reaction gas is selected from a group consisting of hydrogen sulfide and hydrogen selenide.

10. The process of claim 2 comprising conveying said zinc vapor and said reaction gas to the top of said chemical vapor deposition zone so that the flow of said zinc vapor and said reaction gas through said chemical vapor deposition zone are in the same direction as normal gravitational forces.

11. The process of claim 1 comprising introducing said solid metal into said reservoir of molten metal wherein said solid metal is introduced in a limited zone at the surface of the molten metal such that impurities in the metal will not cover the surface of the molten metal.

12. An apparatus for the manufacture of chemically deposited structures by chemical vapor deposition comprising, in combination:
   a means for supplying of solid metal substantially continuously at a controlled rate;
   a heated retort, said retort comprising a body of refractory material having a top and a bottom, and a transverse cross section wherein the cross-section decreases from the top of the retort to the bottom of the retort, wherein said metal is heated in said retort to melt said metal to form a molten metal reservoir having a surface layer and vaporizing said metal to produce metal vapor;
   a chemical vapor deposition chamber defined by a plurality of heated metal plates;
   a means to conduct said metal vapor from said retort to said chemical vapor deposition chamber, said means for conducting said metal vapor to said chemical vapor deposition zone comprises a filter for said metal vapor, a conduit having a first end and a second end with said first end of said conduit attached to said filter for passage of said metal vapor, and a manifold attached to said second end of said conduit, wherein said metal vapor is distributed across the cross section of the chemical vapor deposition chamber; and
   means to provide a reaction gas which is conducted to said chemical vapor deposition chamber in the presence of said metal vapor;
   wherein said metal vapor is reacted with said reaction gas to form a product which is deposited onto said heated mandrel plates to form a chemical vapor deposited structure.

13. The apparatus of claim 12 wherein the means of supplying a metal is a source of zinc.

14. The apparatus of claim 13 wherein the means for supplying the zinc metal is a source of zinc metal in the form of a continuous strip having a narrow cross-section.

15. The apparatus of claim 13 wherein the means for supplying the zinc metal is a wire.

16. The apparatus of claim 14 wherein the means for supplying the zinc metal is a ribbon.

17. The apparatus of claim 12 wherein said retort is heated to vaporization temperature and then maintained at a constant temperature.

18. The apparatus of claim 12 wherein the means for supplying the solid metal includes an induction tube, through which the solid metal passes, said tube extends below the surface of the molten metal in said retort whereby impurities in the metal form a layer of slag in said tube while the pure metal enter the retort and is available for evaporation.

19. The apparatus of claim 12 wherein the cross-section of said retort is conical in shape.

20. The apparatus of claim 12 wherein the means for providing the reaction gas is a source of gas selected from a group consisting of hydrogen sulfide and hydrogen selenide.

21. The apparatus of claim 12 wherein the vapor and means for providing said reaction gas are at the top of said chemical vapor deposition chamber so that the flow of said vapor and said reaction gas through said chemical vapor deposition chamber are in the same direction as normal gravitational forces.

* * * * *